United States Patent
Juco et al.

(10) Patent No.: US 12,394,601 B2
(45) Date of Patent: *Aug. 19, 2025

(54) IMPEDANCE TRANSFORMATION IN RADIO-FREQUENCY-ASSISTED PLASMA GENERATION

(71) Applicant: Lam Research Corporation, Fremont, CA (US)

(72) Inventors: Eller Y. Juco, Tualatin, OR (US); Thomas Lee Frederick, West Linn, OR (US); Karl Frederick Leeser, West Linn, OR (US); Paul Konkola, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/631,368

(22) Filed: Apr. 10, 2024

(65) Prior Publication Data

US 2024/0258073 A1 Aug. 1, 2024

Related U.S. Application Data

(63) Continuation of application No. 17/756,058, filed as application No. PCT/US2020/062924 on Dec. 2, 2020, now Pat. No. 11,984,298.

(Continued)

(51) Int. Cl.
*H01J 37/00* (2006.01)
*H01J 37/32* (2006.01)
*H03H 7/40* (2006.01)

(52) U.S. Cl.
CPC .. *H01J 37/32183* (2013.01); *H01J 37/32082* (2013.01); *H03H 7/40* (2013.01)

(58) Field of Classification Search
CPC .......... H01J 37/32183; H01J 37/32926; H01J 37/32935; H01J 37/32174; H01J 2237/3321; H03H 7/40
See application file for complete search history.

(56) References Cited

U.S. PATENT DOCUMENTS 3,995,237 A 11/1976 Brunner
4,044,357 A 8/1977 Goldie
(Continued)

FOREIGN PATENT DOCUMENTS

CN 1233147 A 10/1999
CN 1619767 A 5/2005
(Continued)

OTHER PUBLICATIONS

Chinese First Office Action dated Aug. 27, 2015 issued in Application No. CN201310467492.0.
(Continued)

*Primary Examiner* — Tuan T Lam
(74) *Attorney, Agent, or Firm* — Weaver Austin Villeneuve & Sampson LLP

(57) ABSTRACT

An apparatus for providing signals to a device may include one or more radiofrequency signal generators, and electrically-small transmission line, which couples signals from the one or more RF signal generators to the fabrication chamber. The apparatus may additionally include a reactive circuit to transform impedance of the electrically-small transmission line from a region of relatively high impedance-sensitivity to region of relatively low impedance-sensitivity.

12 Claims, 8 Drawing Sheets

Related U.S. Application Data

(60) Provisional application No. 62/705,293, filed on Jun. 19, 2020, provisional application No. 62/942,458, filed on Dec. 2, 2019.

(56) References Cited

U.S. PATENT DOCUMENTS

| | | |
|---|---|---|
| 4,316,254 A | 2/1982 | Levin |
| 5,130,678 A | 7/1992 | Edwards |
| 5,155,547 A | 10/1992 | Casper et al. |
| 5,195,045 A | 3/1993 | Keane et al. |
| 5,314,603 A | 5/1994 | Sugiyama et al. |
| 5,369,795 A | 11/1994 | Yanagimoto |
| 5,499,384 A | 3/1996 | Lentz et al. |
| 5,572,170 A | 11/1996 | Collins et al. |
| 5,580,385 A | 12/1996 | Paranjpe et al. |
| 5,643,364 A | 7/1997 | Zhao et al. |
| 5,770,922 A | 6/1998 | Gerrish et al. |
| 5,866,985 A | 2/1999 | Coultas et al. |
| 5,897,713 A | 4/1999 | Tomioka et al. |
| 6,020,794 A | 2/2000 | Wilbur |
| 6,028,014 A | 2/2000 | Sukjarev |
| 6,054,013 A | 4/2000 | Collins et al. |
| 6,068,784 A | 5/2000 | Collins et al. |
| 6,239,587 B1 | 5/2001 | Buck |
| 6,251,792 B1 | 6/2001 | Collins et al. |
| 6,288,493 B1 | 9/2001 | Lee et al. |
| 6,388,226 B1 | 5/2002 | Smith et al. |
| 6,444,137 B1 | 9/2002 | Collins et al. |
| 6,447,636 B1 | 9/2002 | Qian et al. |
| 6,518,195 B1 | 2/2003 | Collins et al. |
| 6,815,633 B1 | 11/2004 | Chen et al. |
| 6,887,339 B1 | 5/2005 | Goodman et al. |
| 6,922,324 B1 | 7/2005 | Horwitz |
| 6,939,434 B2 | 9/2005 | Collins et al. |
| 7,042,311 B1 | 5/2006 | Hilliker et al. |
| 7,777,152 B2 | 8/2010 | Todorov et al. |
| 8,179,050 B2 | 5/2012 | Chen |
| 8,190,380 B2 | 5/2012 | Choueiry et al. |
| 8,368,308 B2 | 2/2013 | Banna et al. |
| 8,617,351 B2 | 12/2013 | Hoffman et al. |
| 9,082,589 B2 | 7/2015 | Thomas et al. |
| 9,518,554 B2 | 12/2016 | Mongin et al. |
| 9,526,161 B2 | 12/2016 | Habu |
| 9,596,744 B2 | 3/2017 | Leeser |
| 9,704,692 B2 | 7/2017 | Leeser |
| 9,773,643 B1 | 9/2017 | Singhal et al. |
| 9,779,196 B2 | 10/2017 | Valcore, Jr. et al. |
| 9,859,088 B2 | 1/2018 | Shaikh |
| 9,918,376 B2 | 3/2018 | Thomas et al. |
| 10,224,184 B2 | 3/2019 | Van Zyl |
| 10,354,838 B1 | 7/2019 | Mopidevi et al. |
| 10,388,485 B2 | 8/2019 | Shaikh |
| 10,553,465 B2 | 2/2020 | Augustyniak et al. |
| 10,950,421 B2 | 3/2021 | Valcore, Jr. |
| 11,527,385 B2 | 12/2022 | Maw et al. |
| 11,756,768 B2 * | 9/2023 | Hasegawa ......... H01J 37/32183 315/111.21 |
| 11,984,298 B2 | 5/2024 | Juco et al. |
| 11,994,542 B2 | 5/2024 | Kapoor et al. |
| 12,136,938 B2 | 11/2024 | Juco et al. |
| 12,205,796 B2 | 1/2025 | Kapoor |
| 12,283,462 B2 | 4/2025 | Mopidevi et al. |
| 2001/0042594 A1 | 11/2001 | Shamouilian et al. |
| 2001/0054383 A1 | 12/2001 | Pu et al. |
| 2002/0023899 A1 | 2/2002 | Khater et al. |
| 2002/0038688 A1 | 4/2002 | Nakano et al. |
| 2002/0129904 A1 | 9/2002 | Itabashi et al. |
| 2002/0180534 A1 | 12/2002 | Bohn et al. |
| 2003/0046013 A1 | 3/2003 | Gerrish |
| 2003/0141821 A1 | 7/2003 | Nakano et al. |
| 2003/0146803 A1 | 8/2003 | Pickard et al. |
| 2003/0157812 A1 | 8/2003 | Narwankar et al. |
| 2004/0032212 A1 | 2/2004 | Yuzurihara et al. |
| 2004/0116080 A1 | 6/2004 | Chen et al. |
| 2004/0195972 A1 | 10/2004 | Cornelius |
| 2004/0253921 A1 | 12/2004 | Turner |
| 2005/0001556 A1 | 1/2005 | Hoffman et al. |
| 2005/0069651 A1 | 3/2005 | Miyoshi et al. |
| 2005/0106873 A1 | 5/2005 | Hoffman et al. |
| 2005/0134186 A1 | 6/2005 | Brouk et al. |
| 2005/0161769 A1 | 7/2005 | Coolbaugh et al. |
| 2005/0205532 A1 | 9/2005 | Patrick et al. |
| 2006/0116106 A1 | 6/2006 | Turner |
| 2007/0153780 A1 | 7/2007 | Stanley |
| 2007/0251920 A1 | 11/2007 | Hoffman |
| 2008/0106206 A1 | 5/2008 | Hooke et al. |
| 2008/0179948 A1 | 7/2008 | Nagarkatti et al. |
| 2008/0264904 A1 | 10/2008 | Yuen et al. |
| 2009/0037999 A1 | 2/2009 | Anderson et al. |
| 2009/0278512 A1 | 11/2009 | Karlicek et al. |
| 2009/0289630 A1 | 11/2009 | Nascimento et al. |
| 2010/0025384 A1 | 2/2010 | Todorow et al. |
| 2010/0171427 A1 | 7/2010 | Kirchmeier et al. |
| 2010/0276391 A1 | 11/2010 | Grimbergen et al. |
| 2011/0063042 A1 | 3/2011 | Mendolia et al. |
| 2011/0101862 A1 | 5/2011 | Koo et al. |
| 2011/0140607 A1 | 6/2011 | Moore et al. |
| 2011/0148303 A1 | 6/2011 | Van Zyl et al. |
| 2011/0214811 A1 | 9/2011 | Ashida |
| 2012/0074844 A1 | 3/2012 | York et al. |
| 2012/0212135 A1 | 8/2012 | Suzuki |
| 2012/0247679 A1 | 10/2012 | Yamazawa |
| 2012/0298303 A1 | 11/2012 | Ikeda et al. |
| 2013/0076343 A1 | 3/2013 | Carpenter et al. |
| 2013/0105082 A1 | 5/2013 | Melikyan et al. |
| 2013/0197874 A1 | 8/2013 | Heckel |
| 2013/0234741 A1 | 9/2013 | Mow et al. |
| 2014/0008357 A1 | 1/2014 | Cheng et al. |
| 2014/0062303 A1 | 3/2014 | Hoffman et al. |
| 2014/0087668 A1 | 3/2014 | Mow et al. |
| 2014/0097751 A1 | 4/2014 | Thomas et al. |
| 2014/0155008 A1 | 6/2014 | Van Zyl |
| 2014/0214350 A1 | 7/2014 | Valcore, Jr. et al. |
| 2014/0231389 A1 | 8/2014 | Nagami et al. |
| 2014/0232483 A1 | 8/2014 | Correa et al. |
| 2014/0367043 A1 | 12/2014 | Bishara et al. |
| 2015/0037972 A1 | 2/2015 | Danek et al. |
| 2015/0221478 A1 | 8/2015 | Himori et al. |
| 2015/0255994 A1 | 9/2015 | Kesler et al. |
| 2015/0313000 A1 | 10/2015 | Thomas et al. |
| 2015/0332894 A1 | 11/2015 | Valcore, Jr. et al. |
| 2015/0340204 A1 | 11/2015 | Kudela et al. |
| 2015/0348854 A1 | 12/2015 | Kapoor et al. |
| 2015/0357210 A1 | 12/2015 | Mori et al. |
| 2015/0371876 A1 | 12/2015 | Terauchi et al. |
| 2016/0065207 A1 | 3/2016 | Bhutta |
| 2016/0087687 A1 | 3/2016 | Kesler et al. |
| 2016/0113103 A1 | 4/2016 | Van Zyl |
| 2016/0181866 A1 | 6/2016 | Moeskops |
| 2016/0295677 A1 | 10/2016 | Leeser |
| 2016/0322215 A1 | 11/2016 | Shaikh |
| 2017/0004955 A1 | 1/2017 | Leeser |
| 2017/0062187 A1 | 3/2017 | Radomski et al. |
| 2017/0117869 A1 | 4/2017 | Leeser et al. |
| 2017/0236693 A1 | 8/2017 | Kobayashi et al. |
| 2017/0244582 A1 | 8/2017 | Gal et al. |
| 2017/0256416 A1 | 9/2017 | Fischer et al. |
| 2017/0330732 A1 | 11/2017 | Valcore, Jr. et al. |
| 2017/0330744 A1 | 11/2017 | Keil et al. |
| 2017/0345620 A1 | 11/2017 | Coumou et al. |
| 2017/0365907 A1 | 12/2017 | Kapoor et al. |
| 2017/0372870 A1 | 12/2017 | Godyak et al. |
| 2018/0023158 A1 | 1/2018 | Sasaki et al. |
| 2018/0025930 A1 | 1/2018 | Augustyniak et al. |
| 2018/0068834 A1 | 3/2018 | Valcore, Jr. et al. |
| 2018/0097520 A1 | 4/2018 | Wu |
| 2018/0130696 A1 | 5/2018 | Konkola et al. |
| 2018/0144903 A1 | 5/2018 | Shaikh |
| 2018/0163302 A1 | 6/2018 | Kapoor et al. |
| 2018/0231587 A1 | 8/2018 | Ye et al. |
| 2018/0261431 A1 | 9/2018 | Hammond, IV et al. |
| 2018/0308663 A1 | 10/2018 | Collins et al. |
| 2018/0308664 A1 | 10/2018 | Collins et al. |

(56) References Cited

U.S. PATENT DOCUMENTS

| | | |
|---|---|---|
| 2018/0350649 A1 | 12/2018 | Gomm |
| 2018/0351322 A1 | 12/2018 | Kurosawa et al. |
| 2018/0366378 A1 | 12/2018 | Kim et al. |
| 2019/0049534 A1 | 2/2019 | Guan |
| 2019/0051496 A1 | 2/2019 | Collins et al. |
| 2019/0068158 A1 | 2/2019 | Coumou et al. |
| 2019/0108979 A1 | 4/2019 | Higuchi |
| 2019/0149119 A1 | 5/2019 | Kapoor et al. |
| 2019/0198345 A1 | 6/2019 | Fischer et al. |
| 2019/0228950 A1 | 7/2019 | Funk et al. |
| 2019/0288737 A1 | 9/2019 | Hanks et al. |
| 2019/0391547 A1 | 12/2019 | Coumou et al. |
| 2020/0010957 A1 | 1/2020 | Chen et al. |
| 2020/0118792 A1 | 4/2020 | Mopidevi et al. |
| 2020/0118856 A1 | 4/2020 | Augustyniak et al. |
| 2020/0126762 A1 | 4/2020 | Yang et al. |
| 2020/0333434 A1 | 10/2020 | Chancey et al. |
| 2020/0381213 A1 | 12/2020 | Lian et al. |
| 2020/0411286 A1 | 12/2020 | Koshimizu et al. |
| 2021/0159107 A1 | 5/2021 | Woo |
| 2021/0183619 A1 | 6/2021 | Patrick et al. |
| 2021/0302478 A1 | 9/2021 | Kapoor et al. |
| 2021/0313948 A1 | 10/2021 | Leeser et al. |
| 2022/0190854 A1 | 6/2022 | Juco et al. |
| 2022/0328236 A1 | 10/2022 | Kapoor |
| 2022/0344129 A1 | 10/2022 | Kapoor |
| 2022/0375721 A1 | 11/2022 | Fields et al. |
| 2022/0415616 A1 | 12/2022 | Juco et al. |
| 2023/0052543 A1 | 2/2023 | Linebarger, Jr. et al. |
| 2023/0223238 A1 | 7/2023 | Guo et al. |
| 2023/0326720 A1 | 10/2023 | Mopidevi et al. |
| 2024/0203711 A1 | 6/2024 | Kapoor et al. |
| 2024/0272210 A1 | 8/2024 | Kapoor et al. |
| 2025/0015819 A1 | 1/2025 | Juco et al. |
| 2025/0038034 A1 | 1/2025 | Topping et al. |
| 2025/0118533 A1 | 4/2025 | Kapoor |
| 2025/0132127 A1 | 4/2025 | Guo et al. |

FOREIGN PATENT DOCUMENTS

| | | | |
|---|---|---|---|
| CN | 1656593 A | | 8/2005 |
| CN | 1925322 A | | 3/2007 |
| CN | 101630624 A | | 1/2010 |
| CN | 101866808 A | | 10/2010 |
| CN | 101933225 A | | 12/2010 |
| CN | 102037789 A | | 4/2011 |
| CN | 102272869 A | | 12/2011 |
| CN | 103533690 A | | 1/2014 |
| CN | 105321792 A | | 2/2016 |
| CN | 107419238 A | | 12/2017 |
| CN | 108109897 A | | 6/2018 |
| CN | 108494381 A | | 9/2018 |
| CN | 109659215 A | | 4/2019 |
| CN | 112753089 A | | 5/2021 |
| EP | 0840350 A2 | | 5/1998 |
| EP | 0935406 A2 | | 8/1999 |
| EP | 0731559 B1 | | 11/2001 |
| EP | 2881579 A1 | | 6/2015 |
| EP | 2881579 B1 | | 3/2019 |
| GB | 1599557 A | | 10/1981 |
| JP | H0589997 A | | 4/1993 |
| JP | H08274067 A | | 10/1996 |
| JP | H11233294 A | | 8/1999 |
| JP | 2001057360 A | | 2/2001 |
| JP | 2001249028 A | | 9/2001 |
| JP | 2003302431 A | | 10/2003 |
| JP | 2004031566 A | | 1/2004 |
| JP | 2005527078 A | | 9/2005 |
| JP | 2006019716 A | | 1/2006 |
| JP | 2006209976 A | | 8/2006 |
| JP | 2006286814 A | | 10/2006 |
| JP | 4352562 B2 | | 10/2009 |
| JP | 2010065240 A | | 3/2010 |
| JP | 2011515790 A | | 5/2011 |
| JP | 2011135766 A | | 7/2011 |
| JP | 2011222292 A | | 11/2011 |
| JP | 5491109 B2 | | 5/2014 |
| JP | 2014099585 A | | 5/2014 |
| JP | 2014142266 A | | 8/2014 |
| JP | 2014186994 A | | 10/2014 |
| JP | 2016009733 A | | 1/2016 |
| JP | 2017143057 A | | 8/2017 |
| JP | 2017199904 A | | 11/2017 |
| JP | 2018011050 A | | 1/2018 |
| JP | 2018022685 A | | 2/2018 |
| JP | 2019504481 A | | 2/2019 |
| JP | 2019071270 A | | 5/2019 |
| JP | 2019517125 A | | 6/2019 |
| JP | 2019133785 A | | 8/2019 |
| JP | 2020510959 A | | 4/2020 |
| JP | 2021052062 A | | 4/2021 |
| KR | 980012069 A | | 4/1998 |
| KR | 20010015590 A | | 2/2001 |
| KR | 20040084477 A | | 10/2004 |
| KR | 20050029122 A | | 3/2005 |
| KR | 20060105668 A | | 10/2006 |
| KR | 20070101654 A | | 10/2007 |
| KR | 20070109275 A | | 11/2007 |
| KR | 20110116939 A | | 10/2011 |
| KR | 20120087925 A | | 8/2012 |
| KR | 20130047532 A | | 5/2013 |
| KR | 101415551 B1 | | 7/2014 |
| KR | 20140104380 A | | 8/2014 |
| KR | 20150139461 A | | 12/2015 |
| KR | 20160000400 A | | 1/2016 |
| KR | 20170054239 A | | 5/2017 |
| KR | 101791706 B1 | | 10/2017 |
| KR | 20170114800 A | | 10/2017 |
| KR | 20180080631 A | | 7/2018 |
| KR | 20180082626 A | | 7/2018 |
| KR | 20190047404 A | | 5/2019 |
| KR | 20190109559 A | | 9/2019 |
| KR | 20200001608 A | | 1/2020 |
| KR | 20200003561 A | | 1/2020 |
| KR | 20200111233 A | | 9/2020 |
| KR | 102505150 B1 | | 2/2023 |
| TW | 200509194 A | | 3/2005 |
| TW | 200518210 A | | 6/2005 |
| TW | I290331 B | | 11/2007 |
| TW | 201141317 A | | 11/2011 |
| TW | 201143546 A | | 12/2011 |
| TW | 201611153 A | | 3/2016 |
| TW | 201808057 A | | 3/2018 |
| TW | 201840989 A | | 11/2018 |
| TW | 201903818 A | | 1/2019 |
| TW | 201935596 A | | 9/2019 |
| TW | 202016974 A | | 5/2020 |
| TW | 202020925 A | | 6/2020 |
| WO | WO-9534945 A2 | | 12/1995 |
| WO | WO-9914855 A1 | | 3/1999 |
| WO | WO-0219387 A2 | | 3/2002 |
| WO | WO-02080220 A1 | | 10/2002 |
| WO | WO-03101160 A2 | | 12/2003 |
| WO | WO-2005031839 A1 | | 4/2005 |
| WO | WO-2009099486 A1 | | 8/2009 |
| WO | WO-2011028600 A2 | | 3/2011 |
| WO | WO-2017100136 A1 | | 6/2017 |
| WO | WO-2018156486 A1 | | 8/2018 |
| WO | WO-2018228133 A1 | | 12/2018 |
| WO | WO-2019079325 A1 | | 4/2019 |
| WO | WO-2019165296 A1 | | 8/2019 |
| WO | WO-2020076413 A1 | | 4/2020 |

OTHER PUBLICATIONS

Chinese First Office Action dated May 17, 2017 issued in Application No. CN 201610428220.3.

Chinese Second Office Action dated Mar. 5, 2018 issued in Application No. CN201610428220.3.

Chinese Third Office Action dated Aug. 15, 2018 issued in Application No. CN201610428220.3.

CN Office Action dated Oct. 11, 2023, in application No. CN202080056165.4 with English translation.

(56) References Cited

OTHER PUBLICATIONS

CN Office Action dated Oct. 24, 2023, in application No. CN202080034447.4 with English translation.
CN Office Action dated Oct. 31, 2024 in CN Application No. 202080074587.4 with English translation.
Final Office Action dated Jul. 7, 2017 issued in U.S. Appl. No. 14/737,377.
International Preliminary Report on Patentability and written opinion dated Aug. 25, 2022 in Application PCT/US2021/017227.
International Preliminary Report on Patentability and written opinion dated Nov. 17, 2022 in Application PCT/US2021/030177.
International Preliminary Report on Patentability and Written Opinion dated Oct. 3, 2024 in PCT Application No. PCT/US2022/030252.
International Preliminary Report on Patentability dated Apr. 14, 2022 from PCT/US2020/053014.
International Preliminary Report on Patentability dated Feb. 10, 2022 issued in Application No. PCT/US2020/070333.
International Preliminary Report on Patentability dated Jan. 12, 2023, in PCT Application No. PCT/US2021/038457.
International Preliminary Report on Patentability dated Jun. 16, 2022, in PCT Application No. PCT/US2020/062924.
International Preliminary Report on Patentability dated Nov. 18, 2021, issued inPCT/US2020/030835.
International Preliminary Report on Patentability dated Oct. 6, 2022 in PCT Application PCT/US2021/023942.
International Preliminary Reporton Patentability dated Dec. 22, 2022, in PCT Application No. PCT/US2021/036163.
International Search Report and Written Opinion dated Apr. 7, 2021 issued in Application No. PCT/US2020/062924.
International Search Report and Written Opinion dated Aug. 17, 2021 issued in Application No. PCT/US2021/030177.
International Search Report and Written Opinion dated Aug. 21, 2020 issued in Application No. PCT/US2020/030835.
International Search Report and Written Opinion dated Dec. 16, 2022 in PCT Application No. PCT/US2022/030252.
International Search Report and Written Opinion dated Feb. 3, 2021 issued in Application No. PCT/US2020/057020.
International Search Report and Written Opinion dated Jan. 19, 2021, for International Application No. PCT/US2020/053014.
International Search Report and Written Opinion dated Jul. 15, 2021 issued in Application No. PCT/US2021/023942.
International Search Report and Written Opinion dated Jun. 4, 2021 issued in Application No. PCT/US2021/017227.
International Search Report and Written Opinion dated Nov. 11, 2020 issued in Application No. PCT/US2020/070333.
International Search Report and Written Opinion dated Oct. 14, 2021, in application No. PCT/US2021/038457.
International Search Report and Written Opinion dated Sep. 27, 2021 issued in Application No. PCT/US2021/036163.
JP Notice of Allowances dated Sep. 3, 2024 in JP Application No. 2022-506171 with English translation.
JP Notice of Allowances dated Sep. 10, 2024 in JP Application No. 2022-530889 with English translation.
JP Office Action dated Apr. 30, 2024 in JP Application No. 2022-506171, with English Translation.
JP Office Action dated Aug. 27, 2024 in JP Application No. 2022-547225 with English translation.
JP Office Action dated Jun. 11, 2024 in JP Application No. 2022-530889 with English translation.
JP Office Action dated Jun. 18, 2024 in JP Application No. 2022-523827 with English Translation.
JP Office Action dated May 7, 2024 in JP Application No. 2021-564697, with English Translation.
JP Office Action dated Oct. 1, 2024 in JP Application No. 2022-520163 with English translation.
Korean Decision for Grant of Patent dated Jan. 18, 2020 issued in Application No. KR 10-2013-0120518.
KR Notice of Allowance dated Nov. 28, 2024 in KR Application No. 10-2023-7006703, with English Translation.
KR Office Action dated Aug. 4, 2022 in Application No. KR10-2022-7013719 With English translation.
KR Office Action dated Aug. 23, 2024 in KR Application No. 10-2023-7006703, with English Translation.
KR Office Action dated Dec. 18, 2024 in KR Application No. 10-2022-7006928, with English Translation.
KR Office Action dated Feb. 24, 2023 in Application No. KR10-2022-7025826 with English translation.
KR Office Action dated Jan. 16, 2024 in KR Application No. 10-2023-7006703 with English translation.
KR Office Action dated May 21, 2024 in KR Application No. 10-2019-0071320, with English translation.
KR Office Action dated Sep. 21, 2022 in Application No. KR10-2022-7025826 with English translation.
Notice of Allowance dated Mar. 31, 2015 issued in U.S. Appl. No. 13/648,183.
Notice of Allowance dated Oct. 31, 2017 issued in U.S. Appl. No. 14/737,377.
Office Action dated Sep. 23, 2016 issued in U.S. Appl. No. 14/737,377.
PCT International Preliminary Report on Patentability dated May 5, 2022 issued in PCT/US2020/057020.
SG Search Report and Written Opinion dated Nov. 1, 2023 in SG Application No. 11202111969R.
SG Search Report and Written Opinion dated Nov. 15, 2023 in SG Application No. 11202202918X.
SG Search report dated Jul. 16, 2024 in Application No. SG11202205585V.
Taiwanese Notice of Allowance dated Jan. 19, 2017 issued in Application No. TW 102136597.
TW Office Action dated Apr. 3, 2024 in TW Application No. 109115006, with English Translation.
TW Office Action dated Aug. 2, 2024 in TW Application No. 109133629 with English translation.
TW Office Action dated May 9, 2024 in TW Application No. 109125947, with English Translation.
TW Office Action dated May 22, 2024 in TW Application No. 109136856, with English translation.
TW Office Action dated Oct. 11, 2024 in TW Application No. 109115006 with English translation.
TW Office Action dated Oct. 11, 2024 in TW Application No. 109125947 with English translation.
TW Office Action dated Sep. 23, 2024 in TW Application No. 110111059 with English translation.
U.S. Corrected Notice of Allowance dated Dec. 5, 2024 in U.S. Appl. No. 17/597,932.
U.S. Corrected Notice of Allowance dated Dec. 20, 2024 in U.S. Appl. No. 18/000,895.
U.S. Corrected Notice of Allowance dated Oct. 7, 2024 in U.S. Appl. No. 17/594,906.
U.S. Final Office Action dated Jun. 28, 2024 in U.S. Appl. No. 17/597,932.
U.S. Non-Final Office Action dated Dec. 21, 2023 in U.S. Appl. No. 17/594,906.
U.S. Non-Final Office Action dated Jul. 3, 2023, in U.S. Appl. No. 16/832,961.
U.S. Non-Final Office Action dated Jul. 5, 2024 in U.S. Appl. No. 18/000,895.
U.S. Non-Final Office Action dated Mar. 8, 2024 in U.S. Appl. No. 17/597,932.
U.S. Notice of Allowance dated Dec. 16, 2024 in U.S. Appl. No. 18/000,895.
U.S. Notice of Allowance dated Feb. 6, 2024 in U.S. Appl. No. 16/832,961.
U.S. Notice of Allowance dated Jan. 12, 2024 in U.S. Appl. No. 17/756,058.
U.S. Notice of Allowance dated Jan. 23, 2024 in U.S. Appl. No. 17/756,058.
U.S. Notice of Allowance dated Jun. 20, 2024 in U.S. Appl. No. 17/594,906.
U.S. Notice of Allowance dated Oct. 20, 2023 in U.S. Appl. No. 16/832,961.
U.S. Notice of Allowance dated Sep. 18, 2024 in U.S. Appl. No. 17/597,932.

(56) References Cited

OTHER PUBLICATIONS

U.S. Appl. No. 18/847,308, inventors Dehghan S, et al., filed on Sep. 16, 2024.
U.S. Appl. No. 18/890,408, inventors Juco E.Y, et al., filed on Sep. 19, 2024.
U.S. Appl. No. 18/982,327, inventor Kapoor S, filed on Dec. 16, 2024.
U.S. Restriction Requirement dated Aug. 16, 2024 in U.S. Appl. No. 17/755,141.
U.S. Restriction requirement dated Aug. 23, 2024 in U.S. Appl. No. 17/907,067.
U.S. Restriction Requirement dated Feb. 24, 2023 in U.S. Appl. No. 16/832,961.
U.S. Restriction requirement dated Oct. 1, 2024 in U.S. Appl. No. 17/997,802.
U.S. Supplemental Notice of Allowance dated Dec. 30, 2024 in U.S. Appl. No. 18/000,895.
KR Office Action dated Jul. 3, 2025 in KR Application No. 10-2022-7042490, with English Translation.
TW Office Action dated May 29, 2025 in TW Application No. 110111059, with English Translation.
US Non-Final Office Action dated Jun. 24, 2025 in U.S. Appl. No. 17/760,159.
U.S. Restriction Requirement dated May 23, 2025 in U.S. Appl. No. 17/754,202.
Andersson C.M., et al., "A Sic Varactor with Large Effective Tuning Range for Microwave Power Applications," IEEE Electron Device Letters, Jun. 2011, vol. 32(6), pp. 788-790.
Araujo D., et., "Diamond for electronics: Materials, processing and devices," Materials, 2021, vol. 14(22), pp. 1-25.
CN Office Action dated Mar. 8, 2025 in CN Application No. 202080069268.4, with English Translation.
Hegazi E., et al., "Varactor Characteristics, Oscillator Tuning Curves, and AM-FM Conversion," IEEE Journal of Solid-State Circuits, Jun. 2003, vol. 38 (6), pp. 1033-1039.
Ibarra A., et al., "Wide Frequency Dielectric Properties of CVD Diamond," Diamond and Related Materials, Apr. 1997, vol. 6(5-7), pp. 856-859.
International Preliminary Report on Patentability and Written Opinion dated Aug. 15, 2024 in PCT Application No. PCT/US2023/011463.
International Preliminary Report on Patentability and Written Opinion dated Feb. 15, 2024 in PCT Application No. PCT/US2022/074608.
International Search Report and Written Opinion dated Jun. 2, 2023, in Application No. PCT/US2023/011463.
International Search Report and Written Opinion dated Nov. 18, 2022 in PCT Application No. PCT/US2022/074608.
Kalish R., "Doping of diamond," Carbon, 1999, vol. 37, pp. 781-785.
Kawarada H., et al., "Wide Temperature K-700k) and High Voltage (~ V) Operation of C-H Diamond MOSFETs for Power Electronics Application," IEEE International Electron Devices Meeting, 2014, 4 Pages.
KR Office Action dated Feb. 19, 2025 in KR Application No. 10-2022-7022290, with English Translation.
KR Office Action dated Jan. 20, 2025 in KR Application No. 10-2022-7017491, with English Translation.
KR Office Action dated Mar. 13, 2025 in KR Application No. 20227030866, with English Translation.
Liao M., et al., Ultra-wide Bandgap Semiconductor Materials, Elsevier, 2019.
Makino T., et al., "Diamond Schottky p. n Diode with High Forward Current Density," Physica status solidi, 2009, pp. 2086-2090.
Masante C., "Diamond MOSFET for Power Electronics. Micro and Nanotechnologies/microelectronics," Universite grenoble alpes, 2019, 159 Pages.
Merchant S., et al., "Realization of High Breakdown Voltage ( 700 V) in Thin SOI Devices," IEEE Proceedings of the 3rd International Symposium on Power Semiconductor Devices and ICs, 1991, pp. 31-35.
Mihai B., "Diamond Schottky Barrier Diodes," 2010.
Peatman W.C.B., et al., "Design and Fabrication of Heterostructure Varactor Diodes for Millimeter and Submillimeter Wave Multiplier Applications," Proceedings IEEE/Cornell Conference on Advanced Concepts in High Speed Semiconductor Devices and Circuits, 1991, pp. 49-57.
Rouger N., et al., "Design of Diamond Power Devices: Application to Schottky Barrier Diodes," Energies, 2019, vol. 12 (12), pp. 1-17.
Sudow M., et al., "Sic Varactors for Dynamic Load Modulation of High Power Amplifiers," IEEE electron device letters, 2008, vol. 29 (7), pp. 728-730.
TW Office Action and Search Report dated Apr. 9, 2025 in TW Application No. 110120724, with English Translation.
TW Office Action and Search Report dated Feb. 18, 2025 in TW Application No. 110115860, with English Translation..
Umezawa H., et al., "Diamond Schottky Barrier Diode for High-temperature, High-power, and Fast Switching Applications," Japanese Journal of Applied Physics, 2014, vol. 53 ,5 Pages.
U.S. Non-Final Office Action dated Mar. 6, 2025 in U.S. Appl. No. 17/907,067.
U.S. Appl. No. 18/681,489, inventors Guo T et al., filed on Feb. 5, 2024.
U.S. Restriction Requirement dated Apr. 10, 2025 in U.S. Appl. No. 17/760,159.
U.S. Restriction Requirement dated Mar. 14, 2025 in U.S. Appl. No. 17/997,802.
Volpe P.N., et al., "Extreme Dielectric Strength in Boron Doped Homoepitaxial Diamond," Applied Physics Letters, 2010, vol. 97, 4 Pages.

* cited by examiner

IMPEDANCE TRANSFORMATION IN RADIO-FREQUENCY-ASSISTED PLASMA GENERATION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Background and contextual descriptions contained herein are provided solely for the purpose of generally presenting the context of the disclosure. Much of this disclosure presents work of the inventors, and simply because such work is described in the background section or presented as context elsewhere herein does not mean that such work is admitted to be prior art.

Fabrication of semiconductor wafers utilized to form integrated circuits may include numerous and diverse processing steps. In certain processing steps, which may occur after various materials are deposited onto a semiconductor wafer, material may be etched away, so as to allow additional materials, such as metals, to be deposited. Such deposition may involve formation of conductive traces, transistor gates, vias, circuit elements, and so forth. However, in at least some instances, semiconductor fabrication processes, such as those involving plasma-based etching, plasma enhanced atomic layer deposition, or other processes, uncontrollable process variations may bring about lower yields, costs, redesign of semiconductor layouts and masks, and so forth. In some instances, such uncontrollable process variations may be brought about in response to variations in energy coupled to the fabrication chamber that is utilized to form a plasma. Accordingly, techniques to increase control over plasma-based wafer etching and/or plasma-enhanced atomic layer deposition, or other fabrication processes, continues to be an active area of investigation.

SUMMARY

In one aspect, an apparatus for providing signals to a device is provided, where the apparatus includes one or more radiofrequency (RF) signal generators, one or more electrically-small transmission lines to couple signals from the one or more of RF signal generators to the fabrication chamber, and a reactive circuit to transform impedance of each of the electrically-small transmission line from a region having a first impedance-sensitivity to a region having a second impedance-sensitivity.

In some aspects, the reactive circuit includes at least series reactance. In some aspects, the reactive circuit includes at least shunt susceptance. In some aspects, the reactive circuit includes at least series reactance and shunt susceptance. In some aspects, the region of relatively high impedance-sensitivity corresponds a region in an impedance space and the real part of the impedance corresponds to a value greater than about 100 ohms. In some aspects, the region of relatively low impedance-sensitivity corresponds to a region in an impedance space and the real part of the impedance corresponds to a value less than about 100 ohms. In some aspects, the reactive circuit to transform the impedance avoids the possibility of a resonant transmission line at any frequency less than the frequency of the signals from the one or more of RF signal generators. In some aspects, the electrically-small transmission line corresponds to a transmission line that transforms an impedance from the region of relatively high impedance-sensitivity to the region of relatively low impedance-sensitivity without traversing a transmission line resonance at a frequency less than the frequency of the signal generated by the RF signal generator in a medium of the transmission line. In some aspects, the resistive loss of the electrically-small transmission line combined with the loss of the reactive circuit correspond to less than about 20%. In some aspects, the resistive loss of the electrically-small transmission line corresponds to less than 10%.

In another aspect, an apparatus is provided, where the apparatus includes an electrically-small transmission line to couple signals from the one or more of RF signal generators to the fabrication chamber and a reactive circuit to transform impedance of the electrically-small transmission line from a region of relatively high impedance-sensitivity to a region of relatively low impedance-sensitivity, the reactive circuit operating to move an impedance control point in a direction opposite to the direction moved by a length of transmission line.

In some aspects, the electrically-small transmission line corresponds to a transmission line that moves the impedance control point from the region of relatively high impedance-sensitivity to the region of relatively low impedance-sensitivity without traversing a transmission line resonance at a frequency less than the frequency of the signal generated by the RF signal generator in a medium of the transmission line. In some aspects, the reactive circuit includes series capacitive reactance. In some aspects, the reactive circuit includes at least shunt inductive susceptance. In some aspects, the reactive circuit includes series capacitive reactance and shunt inductive susceptance. In some aspects, the resistive loss of the electrically-small transmission line combined with the loss of the reactive circuit correspond to less than about 20%. In some aspects, the resistive loss of the electrically-small transmission line corresponds to less than 10%.

In another aspect, an integrated circuit fabrication chamber is provided, where the integrated circuit fabrication chamber includes a plurality of integrated circuit fabrication stations, one or more input ports for coupling a radio frequency (RF) signal to at least one of the plurality of integrated circuit fabrication stations, an electrically-small transmission line to couple signals from the one or more of RF signal generators to the fabrication chamber, and a reactive circuit to transform impedance of the electrically-small transmission line from a region of relatively high impedance-sensitivity to a region of relatively low impedance-sensitivity.

In some aspects, the region of relatively high impedance-sensitivity corresponds a region in an impedance space and the real part of the impedance corresponds to a value greater than about 100 ohms. In some aspects, the region of relatively low impedance-sensitivity corresponds to a region in an impedance space wherein the real part of the impedance corresponds to a value less than about 100 ohms. In some aspects, the region having the first impedance-sensitivity corresponds to a region having low impedance-sensitivity and the region having the second impedance-sensitivity corresponds to a region having high impedance-sensitivity.

DETAILED DESCRIPTION

Figure 1:
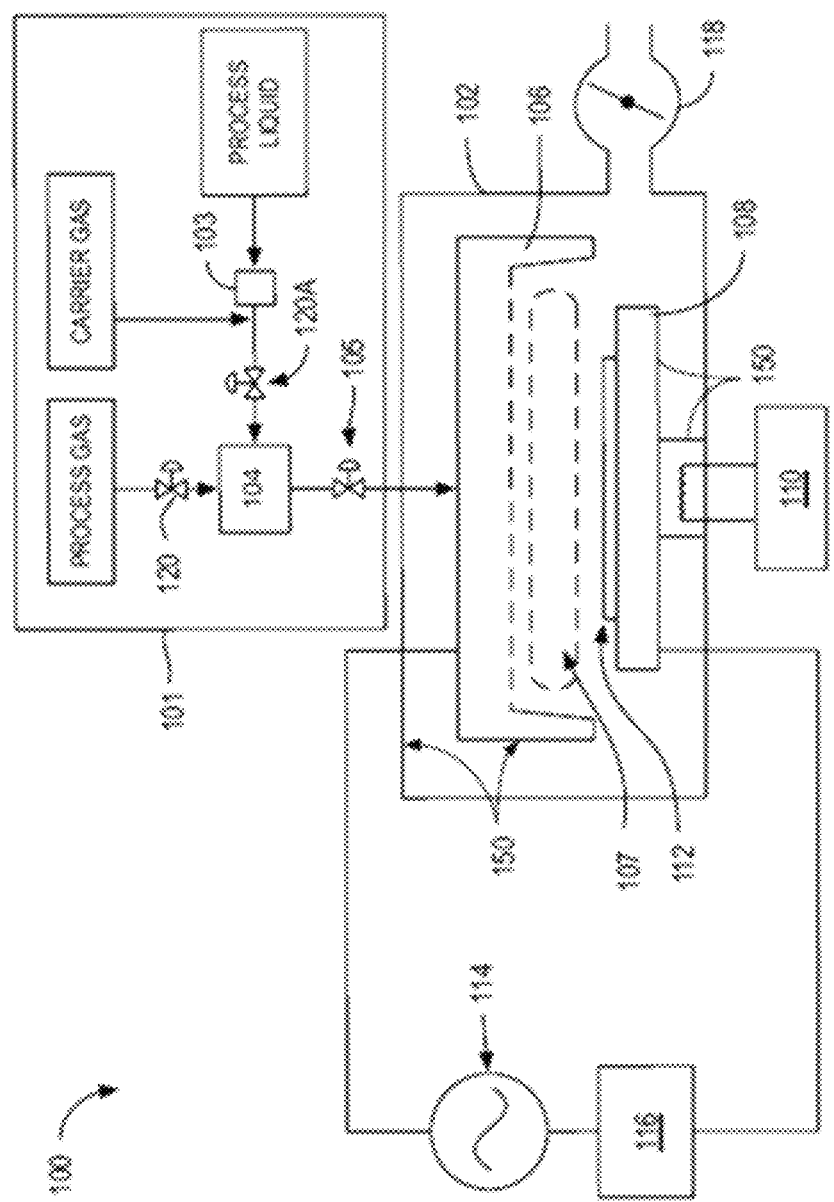
FIG. 1 shows a substrate processing apparatus for depositing films on semiconductor substrates utilizing any number of processes.

In particular embodiments or implementations, impedance transformation in radiofrequency (RF)-assisted plasma generation may be utilized in a variety of semiconductor fabrication processes, such as plasma-based wafer fabrication. Impedance transformation may bring about a capability to more easily control RF power delivered to one or more stations of a multi-station process chamber in a manner that permits dynamic adjustment to varying loads presented by the stations of the process chamber. Such dynamic adjustment provides a real-time capability to match the impedance of loads presented by the plasma within the stations to the source impedance of one or more RF power generators, even as such loads may undergo significant increases and decreases during the course of a fabrication process. Hence, RF power delivered to individual stations can be increased, while RF power reflected from RF power generators may be decreased.

Certain embodiments or implementations may be utilized with a number of wafer fabrication processes, such as various plasma-enhanced atomic layer deposition (ALD) processes, various plasma-enhanced chemical vapor deposition (CVD) processes, or may be utilized on-the-fly during single deposition processes. In certain implementations, RF power matching networks utilize simplified circuit topologies to accommodate load changes at any signal frequency, such as medium frequencies (for example, frequencies between 300 kHz and 3 MHz), high frequencies (for example, frequencies between 3 MHz and 30 MHz), and very high frequencies (for example, frequencies between 30 MHz and 300 MHz). However, in other implementations, RF power matching networks may operate at any signal frequency, such as at relatively low frequencies, such as between 50 kHz and 300 kHz, as well as higher signal frequencies such as frequencies above 300 MHz.

It should be noted that although particular embodiments described herein may show and/or describe electrically-small transmission lines and reactive elements for use with 4 stations of a process chamber, in other embodiments, a smaller number of stations of a process chamber may be utilized, such as 1 station, 2 stations, or 3 stations. In other embodiments electrically-small transmission lines and reactive elements may be utilized with a larger number of stations of a process chamber, such as 5 stations, 6 stations, 7 stations, 8 stations, 10 stations, 12 stations, or any other number of stations of a process chamber.

Manufacturing of semiconductor devices typically involves depositing one or more thin films on a planar or non-planar substrate in an integrated fabrication process. In some aspects of the integrated process, it may be useful to deposit thin films that conform to substrate topography. One type of reaction that is useful in some cases involves chemical vapor deposition (CVD). In typical CVD processes, gas phase reactants introduced into stations of a reaction chamber simultaneously and undergo a gas-phase reaction. The reaction products deposit on the surface of the substrate. The reaction may be driven by plasma, in which case the process may be referred to as a plasma-enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may cause "bread-loafing" deposition effects that show thicker deposition at top surfaces (e.g., top surfaces of gate stacks) and thinner deposition at recessed surfaces (e.g., bottom corners of gate stacks). Further, because some die may have regions of differing device density, mass transport effects across the substrate surface may result in within-die and within-wafer thickness variations. These thickness variations can result in over-etching of some regions and under-etching of other regions, which can degrade device performance and die yield. Another problem related to CVD processes is that they are often unable to form conformal films in high aspect ratio features. This issue is increasingly problematic as device dimensions continue to shrink.

In another example, some deposition processes involve multiple film deposition cycles, each producing a discrete film thickness. For example, in atomic layer deposition (ALD), thin layers of film and used in a repeating sequential matter may be viewed as involving multiple cycles of deposition. As device and features size continue to shrink in the semiconductor industry, and also as three-dimensional devices structures become more prevalent in integrated circuit (IC) design, the capability of depositing thin conformal films (films of material having a uniform thickness relative to the shape of the underlying structure, even if non-planar) continues to gain importance. ALD is a film forming technique which is well-suited to the deposition of conformal films due to the fact that a single cycle of ALD deposits a single thin layer of material, the thickness being limited by the amount of one or more film precursor reactants which may adsorb onto the substrate surface (i.e., forming an adsorption-limited layer) prior to the film-forming chemical reaction itself. Multiple ALD cycles may then be used to build up a film of the desired thickness, and since each layer is thin and conformal, the resulting film substantially conforms to the shape of the underlying devices structure. In certain embodiments, each ALD cycle includes the following steps:

Exposure of the substrate surface to a first precursor.

Purge of the reaction chamber in which the substrate is located.

Activation of a reaction of the substrate surface, typically with a plasma and/or a second precursor.

Purge of the reaction chamber in which the substrate is located.

The duration of an ALD cycle may typically be less than 25 seconds or less than 10 seconds or less than 5 seconds. The plasma exposure step (or steps) of an ALD cycle may be of a short duration, such as a duration of 1 second or less.

FIG. 1 shows a substrate processing apparatus for depositing films on semiconductor substrates using any number of processes. The apparatus 100 of FIG. 1 utilizes single processing station 102 of a process chamber with a single substrate holder 108 (e.g., a pedestal) in an interior volume which may be maintained under vacuum by vacuum pump 118. Also fluidically coupled to the process chamber for the delivery of (for example) film precursors, carrier and/or purge and/or process gases, secondary reactants, etc. is gas delivery system 101 and showerhead 106. Equipment for generating plasma within the process chamber is also shown in FIG. 1. The apparatus schematically illustrated in FIG. 1 may be adapted for performing, in particular, plasma-enhanced CVD.

Figure 2:
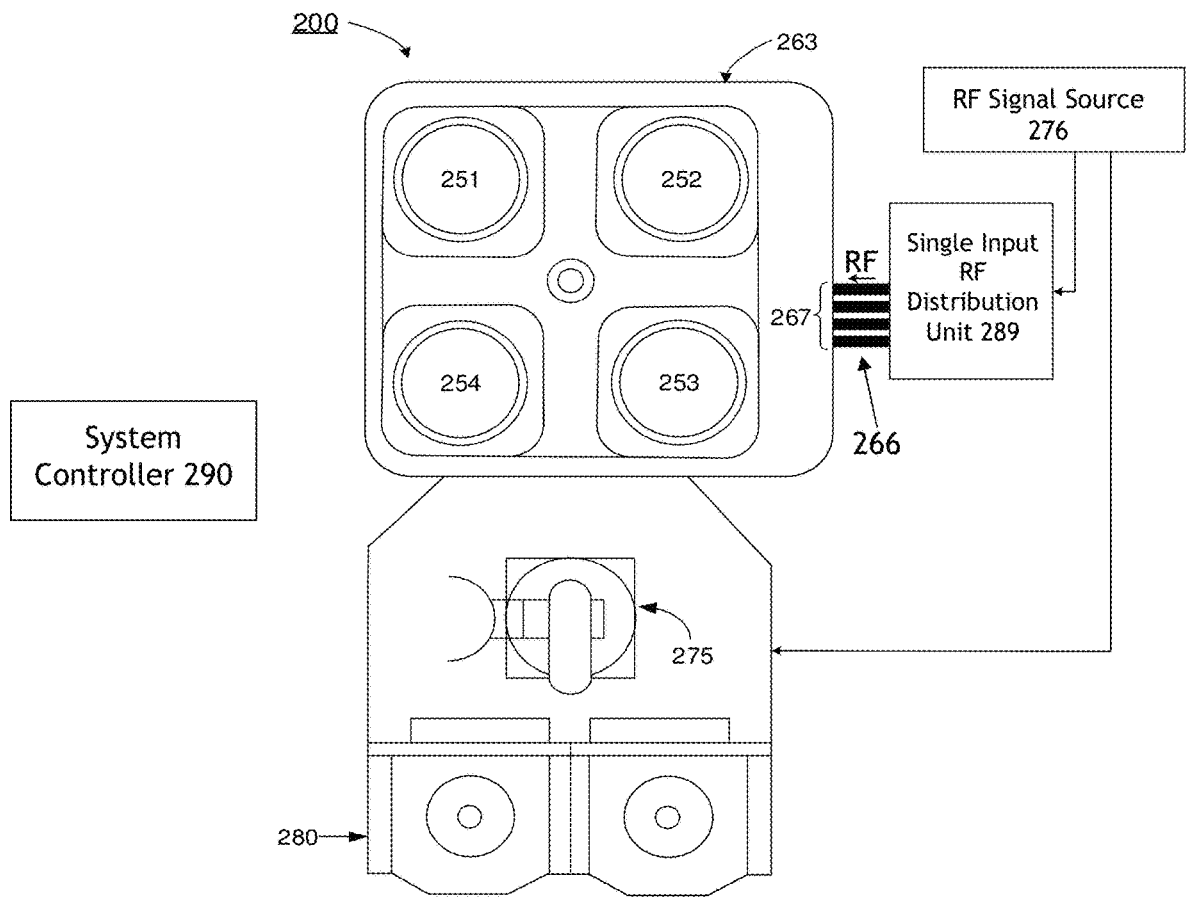
FIG. 2 is a block diagram showing various components of a system utilized to perform a semiconductor fabrication process, according to an embodiment.

For simplicity, processing apparatus 100 is depicted as a standalone process station (102) of a process chamber for maintaining a low-pressure environment. However, it will be appreciated that a plurality of process stations may be included in a common process tool environment—e.g., within a common reaction chamber—as described herein. For example, FIG. 2 depicts an implementation of a multi-station processing tool and is discussed in further detail below. Further, it will be appreciated that, in some implementations, one or more hardware parameters of processing apparatus 100, including those discussed in detail herein, may be adjusted programmatically by one or more system controllers.

Station 102 of the process chamber fluidically communicates with gas delivery system 101 for delivering process gases, which may include liquids and/or gases, to a distribution showerhead 106. Gas delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to station 102 of a process chamber. The implementation of FIG. 1 includes a vaporization point 103 for vaporizing liquid reactant to be supplied to mixing vessel 104. In some implementations, vaporization point 103 may be a heated liquid injection module. In some other implementations, vaporization point 103 may be a heated vaporizer. In yet other implementations, vaporization point 103 may be eliminated from the process station. In some implementations, a liquid flow controller (LFC) upstream of vaporization point 103 may be provided for controlling a mass flow of liquid for vaporization and delivery to processing station 102.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1, substrate 112 is located beneath showerhead 106, and is shown resting on a pedestal 108. Showerhead 106 may have any suitable shape, and may have any suitable number and arrangement of ports for distributing process gases to substrate 112. In some implementations with two or more stations, gas delivery system 101 includes valves or other flow control structures upstream from the showerhead, which can independently control the flow of process gases and/or reactants to each station such that gas may be flowed to one station but not another. Furthermore, gas delivery system 101 may be configured to independently control the process gases and/or reactants delivered to each station in a multi-station apparatus such that the gas composition provided to different stations is different; e.g., the partial pressure of a gas component may vary between stations at the same time.

A volume 107 is located beneath showerhead 106. In some implementations, pedestal 108 may be raised or lowered to expose substrate 112 to volume 107 and/or to vary a volume of volume 107. Optionally, pedestal 108 may be lowered and/or raised during portions of the deposition process to modulate process pressure, reactant concentration, etc., within volume 107.

In FIG. 1, showerhead 106 and pedestal 108 are electrically coupled to radio frequency power supply 114 and matching network 116 for powering a plasma generator. In some implementations, the plasma energy may be controlled (e.g., via a system controller having appropriate machine-readable instructions and/or control logic) by controlling one or more of a process station pressure, a gas concentration, a source of RF power, and so forth. For example, radio frequency power supply 114 and matching network 116 may be operated at any suitable power to form plasma having a desired composition of radical species. Likewise, RF power supply 114 may provide RF power of any suitable frequency, or group of frequencies, and power.

In some implementations, the plasma ignition and maintenance conditions are controlled with appropriate hardware and/or appropriate machine-readable instructions in a system controller which may provide control instructions via a sequence of input/output control (IOC) instructions. In one example, the instructions for setting plasma conditions for plasma ignition or maintenance are provided in the form of a plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of less than 50 milliseconds, with 25 milliseconds being a specific example.

For simplicity, processing apparatus 100 is depicted in FIG. 1 as a standalone station (102) of a process chamber for maintaining a low-pressure environment. However, it may be appreciated that a plurality of process stations may be included in a multi-station processing tool environment, such as shown in FIG. 2, which depicts a schematic view of an embodiment of a multi-station processing tool.

Processing apparatus 200 employs an integrated circuit fabrication chamber 263 that includes multiple fabrication process stations, each of which may be used to perform processing operations on a substrate held in a wafer holder, such as pedestal 108 of FIG. 1, at a particular process station. In the embodiment of FIG. 2, the integrated circuit fabrication chamber 263 is shown having four process stations, 251, 252, 253, and 254, as well as 4 cables 266, which provide RF power to each of the four process stations through input ports 267. Other similar multi-station processing apparatuses may have more or fewer process stations depending on the implementation and, for example, a desired level of parallel wafer processing, size/space constraints, cost constraints, etc. Also shown in FIG. 2 is substrate handler robot 275, which may operate under the control of system controller 290, configured to move substrates from a wafer cassette (not shown in FIG. 2) from loading port 280 and into integrated circuit fabrication chamber 263, and onto one of process stations 251, 252, 253, and 254.

FIG. 2 also depicts an embodiment of a system controller 290 employed to control process conditions and hardware states of processing apparatus 200. System controller 290 may include one or more memory devices, one or more mass storage devices, and one or more processors. The one or more processors may include a central processing unit, analog and/or digital input/output connections, stepper motor controller boards, etc. In some embodiments, system controller 290 controls all of the activities of processing tool 200. System controller 290 executes system control software stored in a mass storage device, which may be loaded into a memory device, and executed on a hardware processor of the system controller. Software to be executed by a processor of system controller 290 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by processing tool 200. These programed processes may include various types of processes including, but not limited to, processes related to determining an amount of accumulation on a surface of the chamber interior, processes related to deposition of film on substrates including numbers of cycles, and processes related to cleaning the chamber. System control software, which may be executed by one or more processors of system controller 290, may be configured in any suitable way. For example, various process tool component subroutines or control objects may be written to control operation of the process tool components necessary to carry out various tool processes.

In some embodiments, software for execution by way of a processor of system controller 290 may include input/output control (IOC) sequencing instructions for controlling the various parameters described above. For example, each phase of deposition and deposition cycling of a substrate may include one or more instructions for execution by system controller 290. The instructions for setting process conditions for an ALD/CFD deposition process phase may be included in a corresponding ALD/CFD deposition recipe phase. In some embodiments, the recipe phases may be sequentially arranged, so that all instructions for a process phase are executed concurrently with that process phase.

Other computer software and/or programs stored on a mass storage device of system controller 290 and/or a memory device accessible to system controller 290 may be employed in some embodiments. Examples of programs or sections of programs for this purpose include a substrate positioning program, a process gas control program, a pressure control program, a heater control program, and a plasma control program. A substrate positioning program may include program code for process tool components that are used to load the substrate onto pedestal 108 (of FIG. 2) and to control the spacing between the substrate and other parts of processing apparatus 200. A positioning program may include instructions for appropriately moving substrates in and out of the reaction chamber as necessary to deposit films on substrates and clean the chamber.

A process gas control program may include code for controlling gas composition and flow rates and optionally for flowing gas into one or more process stations prior to deposition in order to stabilize the pressure in the process station. In some embodiments, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in the exhaust system of the process station, a gas flow into the process station, etc. The pressure control program may include instructions for maintaining the same pressure during the deposition of differing number of cycles on one or more substrates during the processing of the batch.

A heater control program may include code for controlling the current to heating unit 110 (of FIG. 1) that is used to heat the substrate. Alternatively, the heater control program may control delivery of a heat transfer gas (such as helium) to the substrate.

In some embodiments, there may be a user interface associated with system controller 290. The user interface may include a display screen, graphical software displays of the apparatus and/or process conditions, and user input devices such as pointing devices, keyboards, touch screens, microphones, etc.

In some embodiments, parameters adjusted by system controller 290 may relate to process conditions. Non-limiting examples include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring the process may be provided by analog and/or digital input connections of system controller 290 from various process tool sensors. The signals for controlling the process may be output by way of the analog and/or digital output connections of processing tool 200. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 290 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to various embodiments described herein.

For example, the system controller may include control logic for performing the techniques described herein, such as determining an amount of accumulated deposition material currently on at least an interior region of the deposition chamber interior, applying the determine the amount of deposited material, or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior, and performing the compensated number of ALD cycles on one or more substrates in the batch of substrates. The system may also include control logic for determining that the accumulation in the chamber has reached an accumulation limit and stopping the processing of the batch of substrates in response to that determination, and for causing a cleaning of the chamber interior.

In addition to the above-identified functions and/or operations performed by system controller 290 of FIG. 2, the controller may additionally control and/or manage the operations of RF subsystem 295, which may generate and convey RF power to integrated circuit fabrication chamber 263 via radio frequency input ports 267. As described further herein, such operations may relate to, for example, determining upper and lower thresholds for RF power to be delivered to integrated circuit fabrication chamber 263, determining actual (such as real-time) levels of RF power delivered to integrated circuit fabrication chamber 263, RF power activation/deactivation times, RF power on/off duration, operating frequency, and so forth.

In particular embodiments, integrated circuit fabrication chamber 263 may comprise input ports in addition to input port 267 (additional input ports not shown in FIG. 2). Accordingly, integrated circuit fabrication chamber 263 may utilize 8 RF input ports. In particular embodiments, process stations 251-254 of integrated circuit fabrication chamber 165 may each utilize first and second input ports in which a first input port may convey a signal having a first frequency and in which a second input port may convey a signal having a second frequency. Use of dual frequencies may bring about enhanced plasma characteristics, which may give rise to deposition rates within particular limits and/or more easily controlled deposition rates. Dual frequencies may bring about other desirable consequences other than those described herein. In certain embodiments, frequencies of between about 300 kHz and about 300 MHz may be utilized.

In FIG. 2, RF power from a RF signal source 276 may be split among four output channels, which may be coupled to a corresponding one of input port 267 of integrated circuit fabrication chamber 263. In at least particular embodiments, it may be useful for RF power from a RF signal source 276 to be split into relatively equal portions (such as about ±1%). Thus, in an example, if RF signal source 276 provides an output power of 1000 W, about 250 W (±1%) is conveyed to each of input port 267 of fabrication chamber 263.

Figure 3:
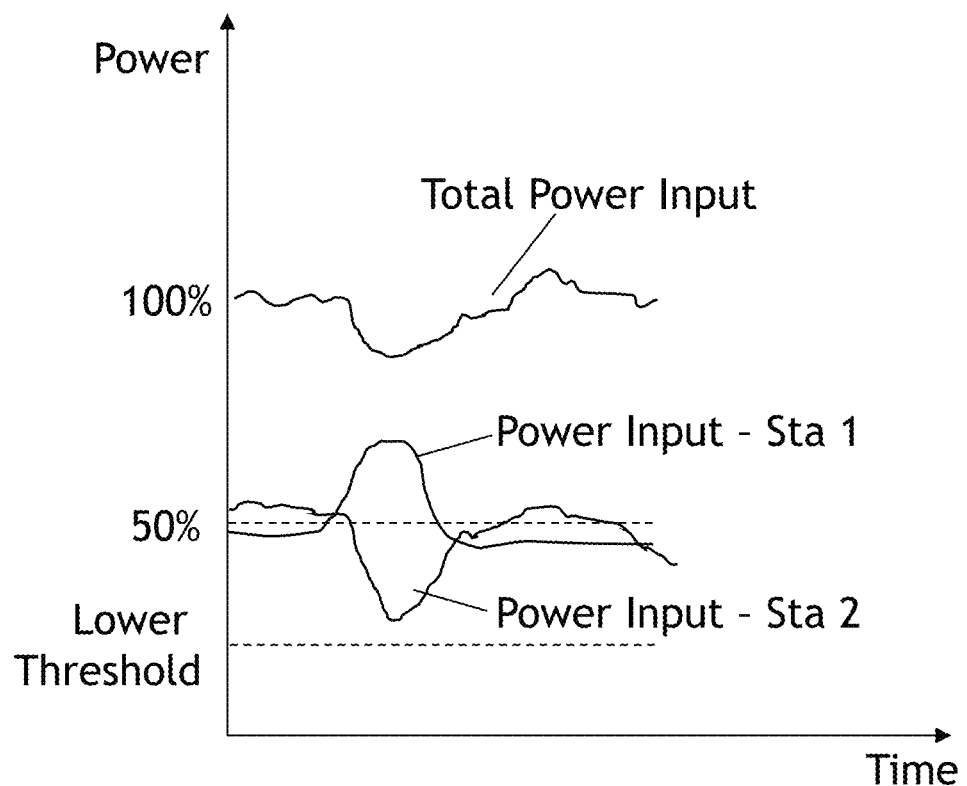
FIG. 3 shows a power versus time profile of radiofrequency (RF) power coupled to stations of a multi-station integrated circuit fabrication chamber, according to an embodiment.

FIG. 3 shows a power versus time profile of RF power coupled to stations of a multi-station integrated circuit fabrication chamber, according to an embodiment. In FIG. 3, the vertical axis indicates delivered power, which corresponds to total power delivered to a fabrication chamber by a RF distribution unit, such as single-input RF distribution unit 289, (of FIG. 2). As indicated by the fluctuating profile of the Total Power Input, power delivered to the single-input RF distribution unit can undergo significant variations, which may include variations of up to 100 W, 150 W, or 200 Watts, for example. Although FIG. 3 depicts a Total Power Input along with power input profiles for first and second process stations (Sta 1 and Sta 2), in other embodiments, power may be coupled to a greater number of stations of a multi-station fabrication chamber, such as 3 stations, 4 stations, 5 stations, and so forth.

Fluctuations in power delivered to a single-input RF distribution unit may occur in response to highly dissimilar RF loads corresponding to an individual station of multi-station integrated circuit fabrication chamber 263. For example, during transitions occurring within a station of fabrication chamber 263, such as during purging of gases utilized during an atomic layer deposition process, a RF load impedance presented by the individual station (e.g., one of stations 251, 252, 253, 254) may increase. In some instances, during a purge portion of an atomic layer deposition cycle when precursor gases are purged or evacuated from a process station, load impedance presented by a particular station may significantly increase. Such increases in load impedance may operate to decrease power coupled to the process station. In contrast, during a portion of an atomic layer distribution cycle when a volume of precursor gases is injected into a fabrication chamber, input impedance presented by a particular station of a multi-station fabrication chamber may significantly decrease.

As shown in FIG. 3, RF power coupled to station 1 (Sta 1) combined with RF power coupled to station 2 (Sta 2) sums to the Total Power Input. Accordingly, although not shown in FIG. 3, it may be appreciated that if the Total Power Input increases, power coupled to each station of the multi-station fabrication chamber may increase proportionally. Additionally, as Total Power Input decreases, power coupled to each station of a multi-station fabrication chamber may decrease proportionally. However, it may also be appreciated that when Total Power Input to the multi-station fabrication chamber decreases while power coupled to a particular station (e.g., Sta 1) increases, power coupled to one or more other stations (e.g., Sta 2) may decrease, so as to maintain a substantially constant Total Power Input.

In the example of FIG. 3, which may relate to a multi-station fabrication chamber having two process stations (Sta 1 and Sta 2), if Total Power Input is held steady, such as at a level of 100% of a nominal value, power coupled to an individual station of a multi-station fabrication chamber may remain at a value that approaches, for example, about 50% of the nominal value. However, also as shown in FIG. 3, at times, RF power coupled to a particular station (e.g., Sta 1) may increase, perhaps for a brief period in response to, for example, a decrease in load impedance resulting from conversion of a gaseous precursor to an ionized plasma material. Responsive to RF power increasing at Sta 1, RF power coupled to Sta 2 may decrease by an amount corresponding to the increase for a similar brief period so as to sum to the Total Power Input. However, as shown in FIG. 3, Total Power Input to the fabrication chamber may occasionally decrease, which may occur in response to a mismatch between the output impedance of the RF power generator and the input impedance of the fabrication chamber. Under such circumstances, when total power input decreases, and power to an individual station (e.g., Sta 1) increases, power coupled to a different station (e.g., Sta 2) may approach the lower threshold shown in FIG. 3.

In particular embodiments, it may be undesirable for power coupled to an individual station to approach or to reach a particular lower threshold. In some instances, responsive to power flow to a station of a multi-station fabrication chamber falling below a lower threshold, the station may represent a high-impedance load. Accordingly, power coupled to other stations of a multi-station fabrication chamber may increase, which may undesirably increase plasma density in the other fabrication stations. In some instances, such increases in power consumption at stations of a multi-station integrated circuit fabrication chamber may bring about arcing or other anomalous plasma events. In some instances, power coupling lower than a threshold level may additionally bring about an imbalance in deposition rates occurring within a multi-station fabrication chamber. Thus, for example, if power coupled to a station falls below a lower threshold at Sta 2, fabrication processes at Sta 2 may be required to be extended. Such extensions may include additional cycles, such as atomic layer deposition cycles, or may involve other additional processing and/or metrology to determine if such power decreases have negatively impacted quality of a fabricated wafer.

Thus, to reduce incidence of power flow falling below a lower threshold, it may be useful to ensure that RF power coupled from a RF power generator (such as RF signal source 276) is maintained at a consistent and relatively high level. Accordingly, an output port, such as an output port of single-input RF distribution unit 289 of FIG. 2, may comprise a matching unit (not shown in FIG. 2), which may operate without user input to insert reactive components (e.g., a series capacitance, a series inductance, a shunt capacitance, a shunt inductance) into the input signal path from RF signal source 276. In some instances, single-input RF distribution unit 289 may make use of one or more computer processors coupled to one or more memory circuits to permit execution of a set of computer-implemented instructions (e.g., an algorithm) which may operate to dynamically insert reactive components into the signal path from RF signal source 276.

Figure 4:
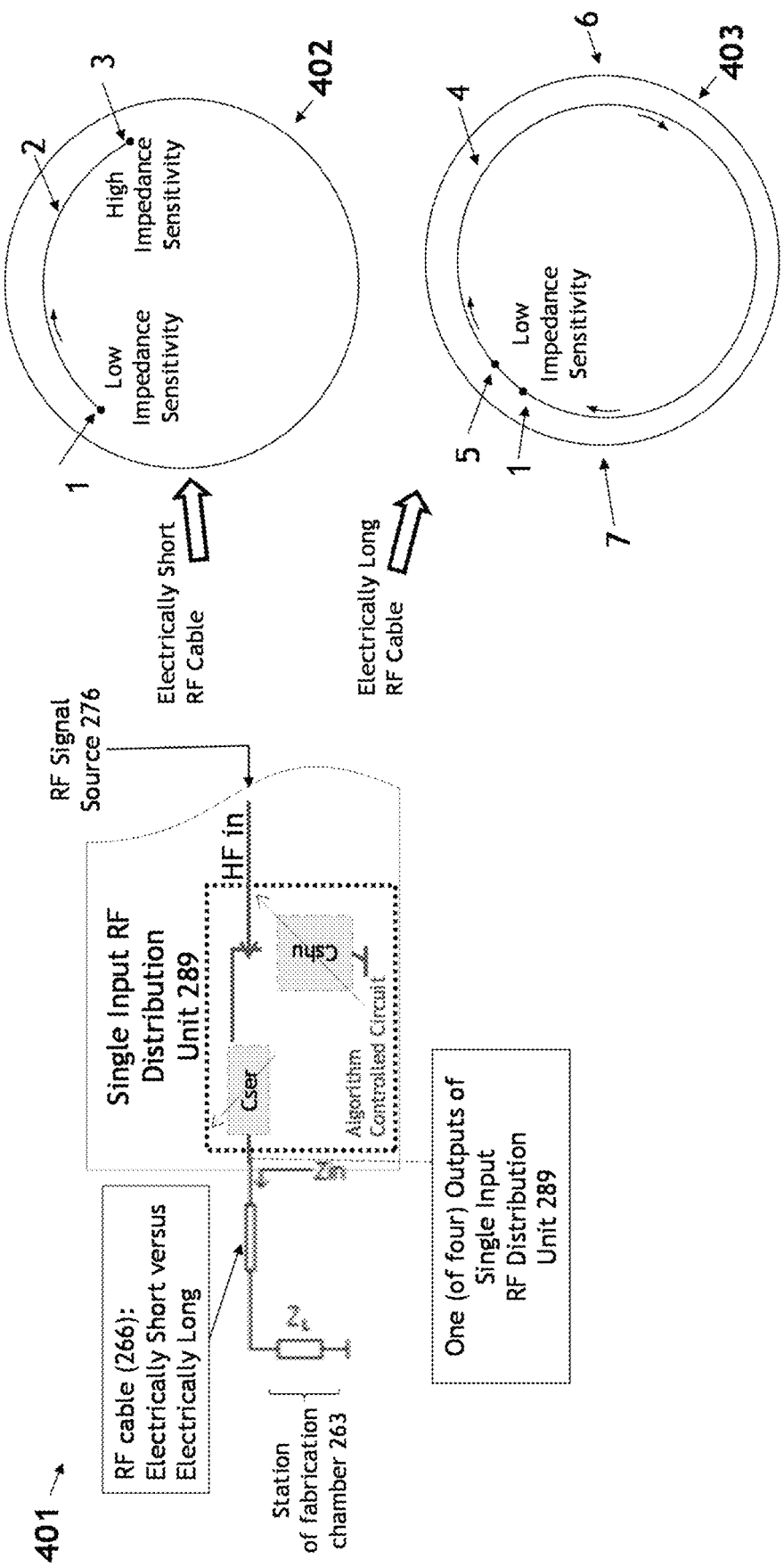
FIG. 4 is a diagram showing a RF matching unit coupled through transmission lines of differing lengths to a load ($Z_L$), along with corresponding impedance plots in an impedance space, according to an embodiment.

FIG. 4 is a diagram showing a RF matching unit coupled through transmission lines of first or second lengths to a load impedance ($Z_L$), along with corresponding impedance plots in a representative impedance space, according to an embodiment.

In FIG. 4, diagram 401 shows RF signal source 276 is indicated as providing an input to single-input RF distribution unit 289. As previously mentioned herein, single-input RF distribution unit 289 may utilize reactive components (e.g., a series capacitance, a series inductance, a shunt capacitance, a shunt inductance), which are indicated as Cser and Cshu in FIG. 4. Values of reactive components Cser and Cshu may be controlled via a computer, so as to be dynamically adjusted according to varying loads presented by an individual station of multi-station integrated circuit fabrication chamber 263. The load impedance presented by an individual station of fabrication chamber 263 is indicated as $Z_L$ in FIG. 4. Although not shown in FIG. 4, additional load impedances are presented by other stations of fabrication chamber 263 (e.g., Sta 1, Sta 2, Sta 3, etc.). In particular embodiments, individual station load $Z_L$ may correspond to a load having a relatively small real part and a relatively significant imaginary part. In the particular example of FIG. 4, the impedance measured at the plane of $Z_L$ may be characterized as having a real impedance value of between about 1-10 ohms and having an imaginary impedance of between about 10-40 ohms.

In particular embodiments, electrically short cable 266, such as a coaxial cable between about 35 inches and about 45 inches, may be utilized to couple single-input RF distribution unit 289 to an input port of a station of a multi-station integrated circuit fabrication chamber. Thus, in the example of FIG. 4, transforming the load impedance presented by $Z_L$ in representative impedance space 402 from the plane of $Z_L$ to the control point at an output port of single-input RF distribution unit 289 corresponds to rotating the plane of $Z_L$ through approximately a fraction of a wavelength in a transmission medium (e.g., a coaxial cable). In this instance, a transmission medium may correspond to a 50-ohm coaxial cable. Accordingly, rotating the load through a fraction of a wavelength at the signal frequency (with respect to the center point of representative impedance space 402) transforms the load to an impedance value corresponding to an impedance having a real component of between about 25-50 ohms and a reactive component of between about 100-200 ohms. Representative impedance space 402 shows point (1) being is rotated through an path (2), which correspond to approximately a fraction of one wavelength to arrive at point (3).

It may be appreciated that representative impedance space 402 of FIG. 4 includes a region of relatively low impedance-sensitivity (corresponding to areas of the representative impedance space at which real and imaginary components of an impedance are less than about 100 ohms). Representative impedance space 402 may additionally include a region of relatively high impedance-sensitivity (corresponding to areas of the impedance space in which the real and imaginary components of an impedance are greater than about 100 ohms). Thus, it may be appreciated that rotation of the plane of load impedance $Z_L$ through a fraction of a wavelength has the effect of transforming impedance $Z_L$ from a region of low impedance-sensitivity, such as a region corresponding to relatively low real and imaginary impedances (e.g., a ratio of reactance to resistance <2.5), to a region of high impedance-sensitivity, such as a region corresponding to relatively high real and imaginary impedances (e.g., a ratio of reactance to resistance >2.5). However, as further discussed in relation to FIG. 5A, in some instances, it may be difficult to determine accurate values for reactive components, such as Cser and Cshu of FIG. 4, so as to arrive at capacitive reactance or inductive susceptance that provide a conjugate match or other type of match that operates to provide maximum power flow to load impedance $Z_L$ and minimum reflected power.

Figure 5A:
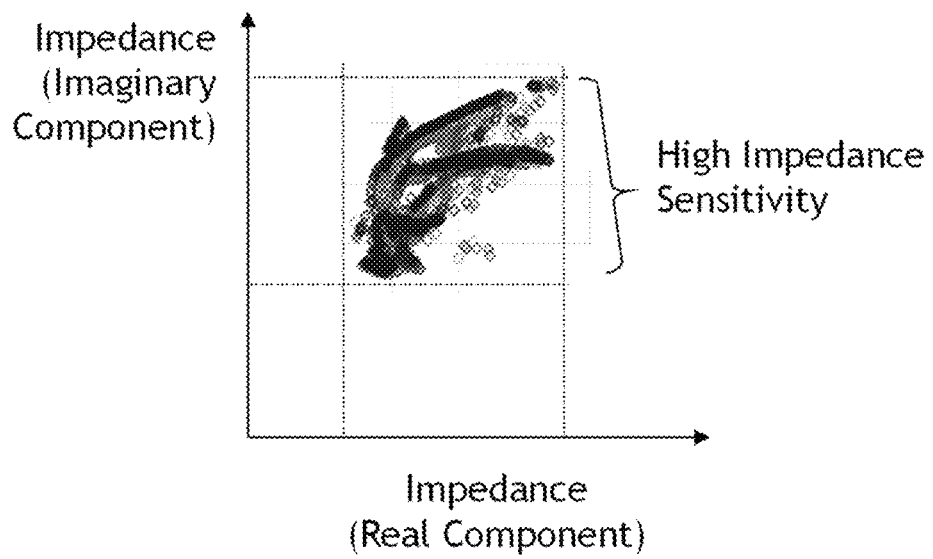
FIGS. 5A and 5B depict impedance-sensitivity at a control point of a RF matching unit responsive to transmission lines of varying lengths, according to an embodiment.
Figure 5B:
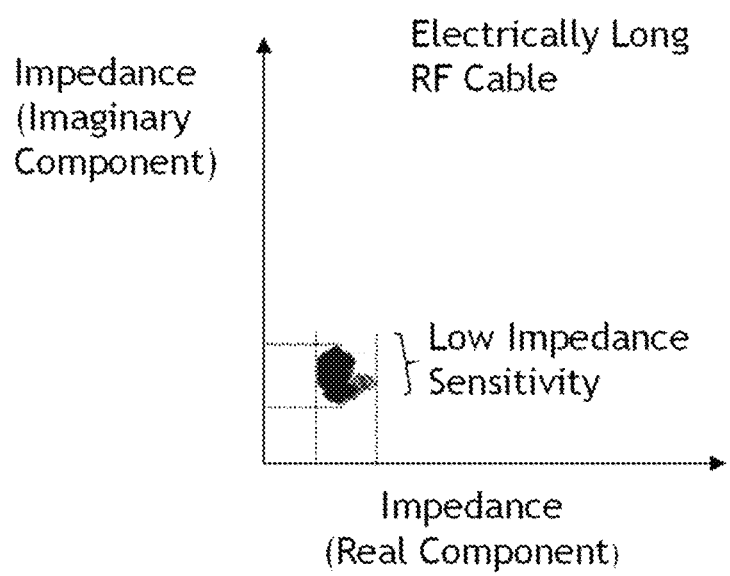

FIGS. 5A and 5B depict impedance-sensitivity at a control point of a RF matching unit responsive to transmission lines of varying lengths, according to an embodiment. As depicted in FIG. 5A, determining real and imaginary components necessary to bring about a match, such as a conjugate match, resulting in a low reflection coefficient from if a load impedance positioned in a region of high impedance-sensitivity, may be problematic. Accordingly, transforming an impedance, such as through an electrically short transmission line (at a frequency of between 10 and 100 MHz) may result in an undesirably high standard deviation in impedance introduced by resistive and reactive circuit elements. Thus, efforts to match such loads may require multiple iterations as resistive and reactive elements are inserted into a matching network, tested to determine the effect of the insertion of such elements on a reflection coefficient (or voltage standing wave ratio), and then adjusted and remeasured, in an effort to drive the reflection coefficient to below a threshold value. Such impedance transformation is illustrated in representative impedance space 402 of FIG. 4 in which load impedance $Z_L$ at point (1) lies in a region of low impedance-sensitivity. Rotation of point (1) through path (2) of the representative impedance space results in transformation of load impedance $Z_L$ to point (3) within a region of high impedance-sensitivity.

However, referring again to FIG. 4 at representative impedance space 403, use of a RF cable (266) having a greater electrical length at a frequency of between about 10 MHz and about 100 MHz may operate to transform load impedance $Z_L$ from a first region of low impedance-sensitivity to a second region of low impedance-sensitivity. As shown in representative impedance space 403 of FIG. 4, rotation from point (1) through a path (4) to arrive at point (5) corresponds to an impedance transformation from a point within a region of low impedance-sensitivity to a second point within the region of low impedance-sensitivity. The length of path (4) corresponds to the number of wavelengths represented by a 10-20 cable at an operating frequency of between 10 MHz and 100 MHz. In an example, such as that of FIG. 4 (lower right portion), a 15-foot coaxial cable transmission line represents slightly more than one-half wavelength. It may also be appreciated that such rotation through path (4) avoids attempting to provide a conjugate match within a region of high impedance-sensitivity.

FIG. 5B illustrates uncertainty in real and imaginary impedances corresponding to point (5) indicated in representative impedance space 403 (of FIG. 4). As shown in FIG. 5B, uncertainty surrounding point (5) corresponds to relatively low standard deviation in impedance introduced by reactive elements to provide a conjugate match. Thus, matching such loads may require only a single measurement of reflection coefficient followed by insertion of a suitable resistive and/or reactive circuit element to drive the measured reflection coefficient to a value below a threshold value.

However, it should be pointed out that in addition to regions of low impedance-sensitivity and high impedance-sensitivity, representative impedance spaces 402 and 403 of FIG. 4 may include areas of resonance and anti-resonance. For example, referring to impedance space 403, transformation of load impedance ($Z_L$) from point (1) to point (5) via an electrically long (e.g., between about 10 feet and about 20 feet) coaxial cable corresponds to crossing resonant and anti-resonant points of the impedance space. For example, transformation of load impedance $Z_L$ from point (1) through path (4) shown on representative impedance space 403 is shown as crossing point (6), which may correspond to a point of theoretically infinite impedance. At such a point, voltage present on a transmission line (e.g., a coaxial cable) may increase to a relatively high value while current decreases to a relatively low value. Such high values of voltage occurring in a transmission line responsive to traversing anti-resonant point (6) may bring about breakdown of a dielectric of the coaxial cable and/or bring about other undesirable consequences.

It should be noted that in particular embodiments, impedance transformation may take place from a region having a first impedance-sensitivity to a region having a second impedance-sensitivity.

Path (4) shown on representative impedance space 403 additionally crosses or traverses point (7), which may represent a point of theoretically 0 (zero) impedance. At such a point, a voltage present on a transmission line (e.g., a coaxial cable) may decrease to a very low or negligible value while current increases to a very high value. Such high values of current may bring about excessive heating of a coaxial cable, which may damage the coaxial cable and/or RF signal source 276.

Further, aside from traversal of resonant (e.g., high current/low voltage) points and anti-resonant (e.g., high voltage/low current) points, use of longer cables, such as a 15-foot cable may bring about other undesirable consequences, such as increased resistive losses. In addition, use of longer cables may give rise to cable routing concerns, in which excess cable lengths must be coiled, stowed, or otherwise set aside so as not to interfere with other equipment associated with a fabrication chamber. Such coiling of excess cable lengths, for example, may give rise to parasitic effects, in which adjacent sections of a coiled cable interact with one another, which may give rise to increased capacitance which, in turn, can affect characteristic impedance (Z0) of the cable.

Thus, for the above-identified reasons, it may be desirable to utilize electrically-small transmission lines (e.g., an approximately 10-inch to 50-inch coaxial cable) rather than electrically longer transmission lines (e.g. an approximately 10-foot to 20-foot coaxial cable). In this context, the term "electrically-small" refers to a transmission line that transforms an impedance from a region of relatively high impedance-sensitivity to a region of relatively low impedance-sensitivity without traversing a transmission line resonance, or a transmission line anti-resonance, at a frequency less than the frequency of the signal generated by the RF signal generator in a medium of the transmission line. Thus, as an example, a 40-inch transmission line conveying a signal having a frequency of between 1 MHz and 50 MHz may be categorized as electrically-small in that transforming a load impedance $Z_L$ from point (1) to point (3) of a representative impedance space does not traverse an anti-resonance point (6). On the other hand, a 15-foot transmission line conveying a signal having a frequency of between about 1 MHz and 50 MHz may be categorized as not being electrically-small in that transforming a load impedance $Z_L$ from point (1) to point (5) of a representative impedance space traverses anti-resonance point (6).

Figure 6A:
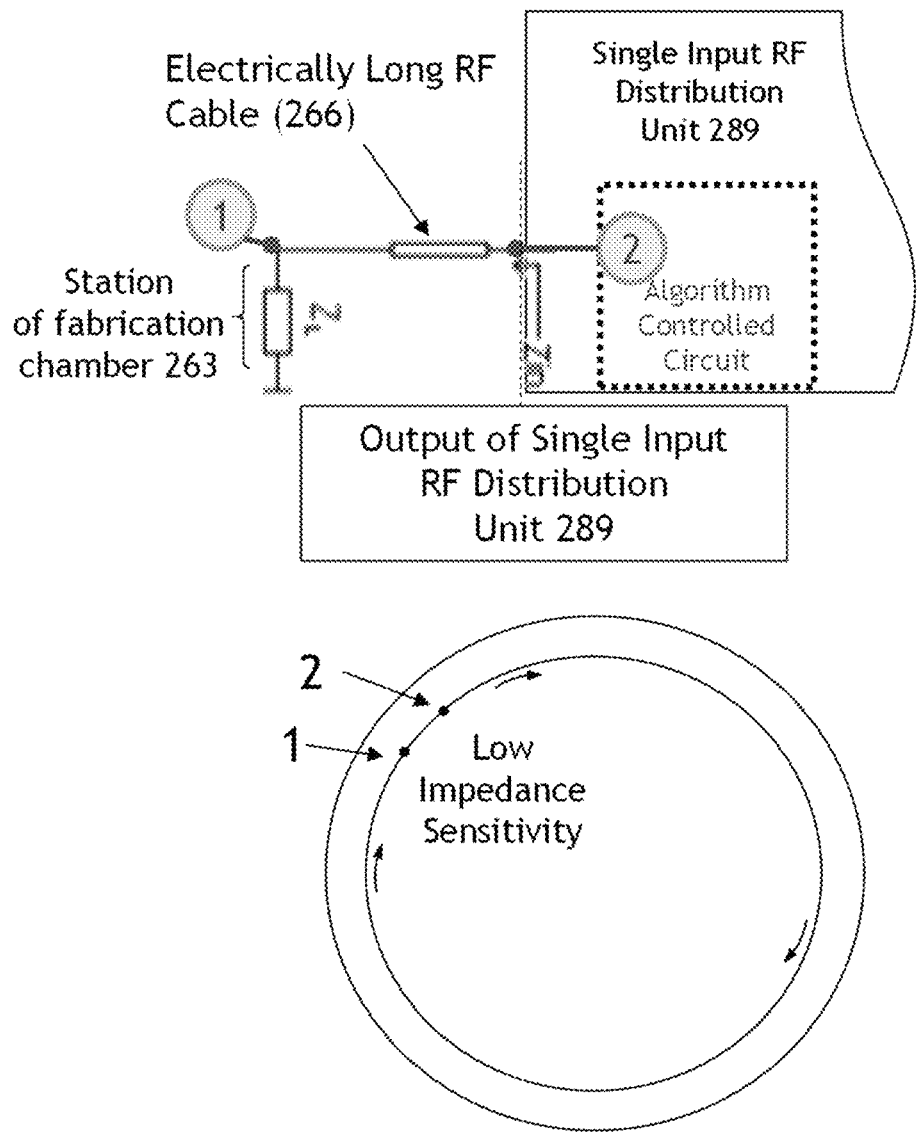
FIGS. 6A and 6B are diagrams showing use of an electrically-small transmission line and reactive components arranged so as to transform impedance of the control point from a relatively high impedance-sensitivity region of an impedance space into a relatively low impedance-sensitivity region of an impedance space, according to an embodiment.
Figure 6B:
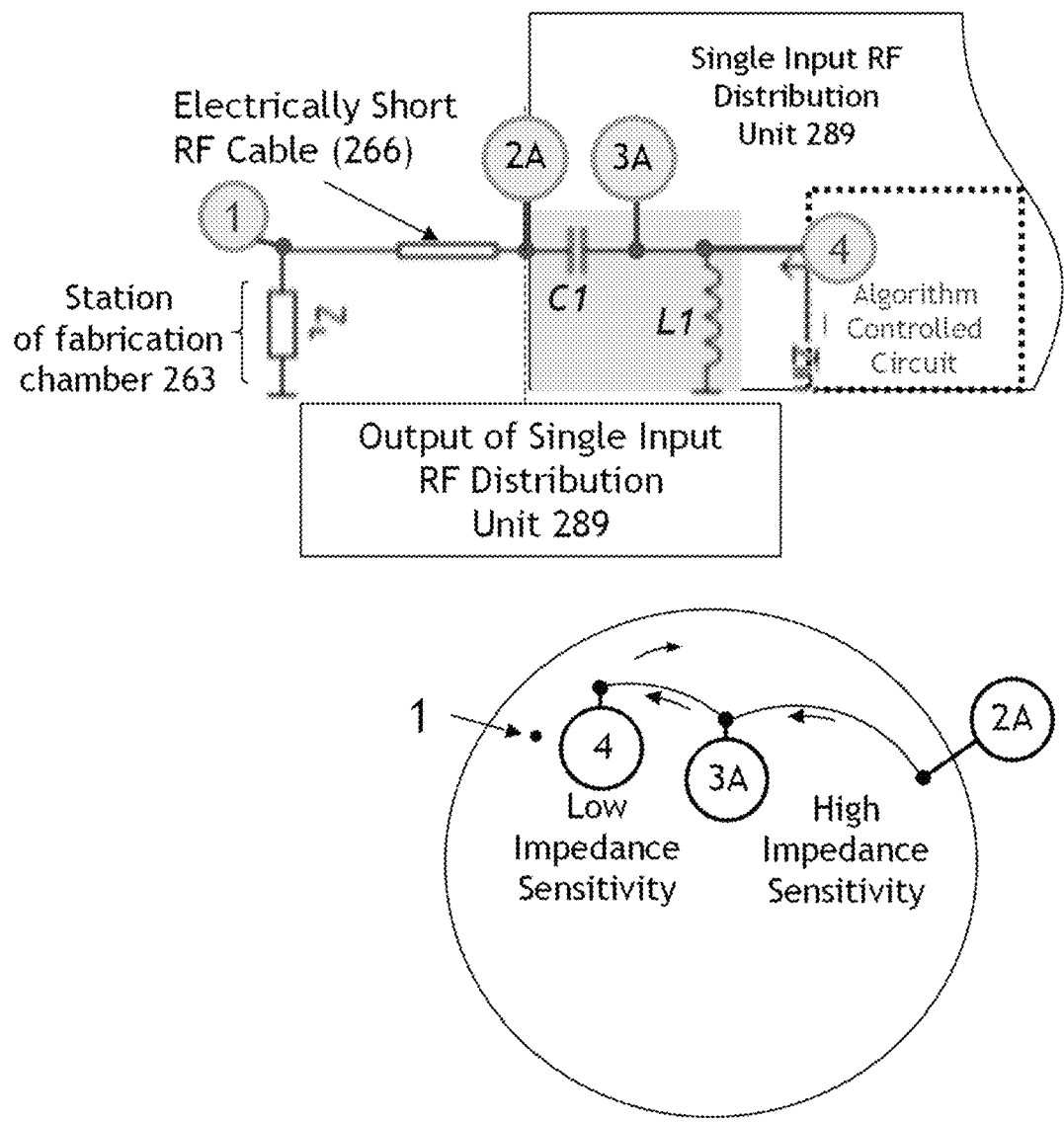

FIGS. 6A and 6B are diagrams showing use of an electrically-small transmission line and reactive components arranged so as to transform impedance of the control point from a relatively high impedance-sensitivity region of an impedance space into a relatively low impedance-sensitivity region of an impedance space, according to an embodiment.

As shown in FIG. 6A, an electrically long (e.g., 15-foot) cable is utilized to transform a load impedance ($Z_L$), which represents a load presented by a process station of multi-station integrated circuit fabrication chamber 263. As previously discussed in reference to FIGS. 4 and 5A and 5B, a load impedance ($Z_L$) may be transformed from a first point in a region of low impedance-sensitivity to a second point in the region of low impedance-sensitivity. Such control may be brought about by way of a computer-controlled matching network (e.g., via execution of an appropriate algorithm) at single-input RF distribution unit 289. However, also as previously mentioned, use of an electrically long (e.g., 15-foot) cable, or other transmission line that permits traversal of resonant or anti-resonant points of a representative impedance space, may bring about undesirable consequences, such as increased resistive losses, changes in parasitic capacitance, cable routing/stowage issues, and so forth.

Accordingly, to avoid the above-identified shortcomings, an electrically-small cable, along with an appropriate reactive circuit, may be utilized to transform a load impedance from the plane corresponding to an input port of a station of a multi-station fabrication chamber to a desired control point. Particular embodiments may overcome disadvantages in the use of an electrically-small cable, such as transformation of a load impedance from a region of low impedance-sensitivity to a region of high impedance-sensitivity. Accordingly, in FIG. 6B, a load impedance ($Z_L$) is shown as being transformed from point (1) to point (2A). As previously described herein, such transformation corresponds to transformation of an impedance from a region of low impedance-sensitivity to a region of high impedance-sensitivity. However, by way of insertion of a lumped-element shunt inductor (e.g., L1 in FIG. 6B) the impedance at a control point of single RF distribution unit is moved in a representative impedance space through a path created by the insertion of L1. Accordingly, it may be appreciated that such transformation of the impedance of the control point may be desirable in that such transformation assists in avoiding the necessity of matching at a high impedance-sensitivity portion of an impedance space. An additional transformation of the load impedance from an area of high impedance-sensitivity to an area of low impedance-sensitivity may be achieved through the use of a lumped-element series reactance, such as insertion of C1 in a circuit, as shown in FIG. 6B. It may be appreciated that insertion of such reactance brings about movement of the control point, such as from point (3A) to point (4) in the impedance space of FIG. 6B.

Thus, in particular embodiments, electrically-small transmission lines may be utilized to couple a RF distribution unit to an input port to a station of a multi-station fabrication chamber. Use of such electrically-small transmission lines may avoid various shortcomings, such as attempting to provide a conjugate match in an area of high impedance-sensitivity. Such electrically-small transmission lines may be utilized in conjunction with insertion of circuit elements that bring about capacitive reactance or inductive susceptance. Use of such circuit elements assists in transforming an impedance from an area of high impedance-sensitivity back to an area of low impedance-sensitivity. Further, use of such electrically-small transmission lines, along with appropriate inductive/capacitive circuit elements, which may be coupled as series devices or shunt devices, may provide relatively low resistive losses, decreased capacitive coupling, such as among adjacent segments of longer and perhaps coiled transmission lines as well as avoiding cable routing concerns. In particular embodiments, through the use of electrically-small transmission lines (such as 10-inch to 50-inch coaxial cables) resistive loss of a transmission line may be reduced to a minimal amount, such as below 5%, below 10%, or below 15%. In addition, although insertion of various circuit elements such as shunt inductors and series capacitors may give rise to resistive losses. Combined losses, which include transmission line losses as well as losses from various circuit elements, may be maintained below nominal levels, such as below about 20%.

Although the example of FIG. 6B utilizes insertion of a shunt inductor to provide inductive susceptance, and a series capacitor to provide capacitive reactance, in other embodiments, different circuit topologies may be utilized. Thus, other embodiments may include various combinations of capacitive elements, inductive elements, resistive elements, transmission line lengths, etc., according to particular impedance transformation requirements.

Figure 7:
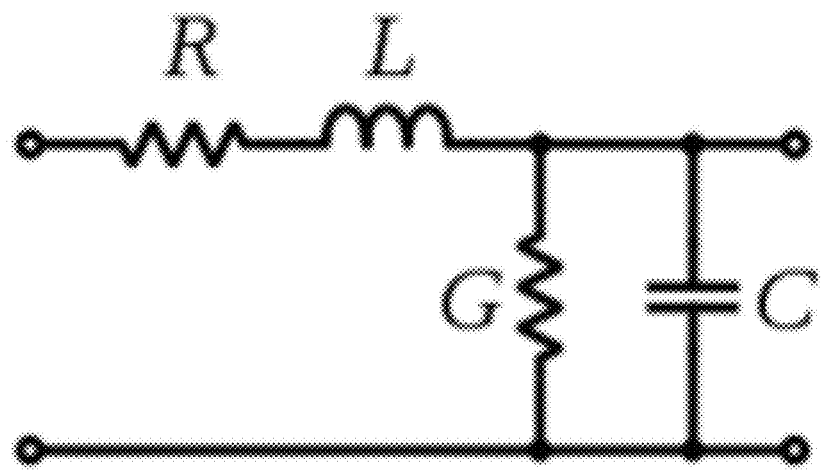
FIG. 7 is a circuit diagram for a transmission line model according to an embodiment.

FIG. 7 is a circuit diagram for a transmission line model according to an embodiment.

In FIG. 7, a series inductance (L) and a shunt capacitance (C) are indicated. The lumped elements of FIG. 7 are contrasted with the lumped elements of FIG. 6B, in which a series capacitance (C1) and shunt inductance (L1) are utilized. Thus, the lumped circuit elements of FIG. 6B represent the opposite (or inverse) of the standard transmission line model of FIG. 7.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The foregoing detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementation, it is to be understood that these examples are not limiting; other embodiments or implementation may be used and changes may be made to the disclosed embodiments or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically includes a diameter of 200 mm, or 300 mm, or 450 mm. The foregoing detailed description assumes embodiments or implementations are implemented on a wafer, or in connection with processes associated with forming or fabricating a wafer. However, the claimed subject matter is not so limited. The work piece may be of various shapes, sizes, and materials. In addition to semiconductor wafers, other work pieces that may take advantage of claimed subject matter may include various articles such as printed circuit boards, or the fabrication of printed circuit boards, and the like.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus for providing signals to a device, comprising:
   one or more electrically-small transmission lines to couple signals from one or more RF signal generators to a fabrication chamber; and
   a reactive circuit to transform impedance of each of the one or more electrically-small transmission lines from a region having a first impedance-sensitivity to a region having a second impedance-sensitivity.

2. The apparatus of claim 1, wherein the reactive circuit comprises at least series reactance.

3. The apparatus of claim 1, wherein the reactive circuit comprises at least shunt susceptance.

4. The apparatus of claim 1, wherein the reactive circuit comprises at least series reactance and shunt susceptance.

5. The apparatus of claim 1, wherein the region having the first impedance-sensitivity corresponds to a region of relatively high impedance-sensitivity in an impedance space and wherein a real part of the impedance corresponds to a value greater than about 100 ohms.

6. The apparatus of claim 1, wherein the region having the second impedance-sensitivity corresponds to a region of relatively low impedance-sensitivity in an impedance space and wherein a real part of the impedance corresponds to a value less than about 100 ohms.

7. The apparatus of claim 1, wherein the reactive circuit to transform the impedance avoids the possibility of a resonant transmission line at any frequency less than the frequency of the signals from the one or more RF signal generators.

8. The apparatus of claim 1, wherein an electrically-small transmission line of the one or more electrically-small transmission lines corresponds to a transmission line that transforms an impedance from a region of relatively high impedance-sensitivity to a region of relatively low impedance-sensitivity without traversing a transmission line resonance at a frequency less than the frequency of the signal generated by an RF signal generator of the one or more RF signal generators in a medium of the transmission line.

9. The apparatus of claim 1, wherein a resistive loss of an electrically-small transmission line of the one or more electrically-small transmission lines combined with a loss of the reactive circuit correspond to less than about 20%.

10. The apparatus of claim 1, wherein a resistive loss of an electrically-small transmission line of the one or more electrically-small transmission lines corresponds to less than 10%.

11. The apparatus of claim 1, wherein the reactive circuit operates to move an impedance control point in a direction opposite to the direction moved by a length of transmission line.

12. The apparatus of claim 1, wherein the fabrication chamber comprises a plurality of integrated circuit fabrication stations.

* * * * *